United States Patent
Shi et al.

(10) Patent No.: US 10,578,800 B2
(45) Date of Patent: Mar. 3, 2020

(54) SILICON PHOTONIC INTEGRATED CIRCUIT WITH ELECTROSTATIC DISCHARGE PROTECTION MECHANISM FOR STATIC ELECTRIC SHOCKS

(71) Applicant: SiFotonics Technologies Co., Ltd., Grand Cayman (KY)

(72) Inventors: Tuo Shi, Beijing (CN); Tzung-I Su, Taoyuan (TW); Yongbo Shao, Beijing (CN); Dong Pan, Andover, MA (US)

(73) Assignee: SIFOTONICS TECHNOLOGIES CO., LTD., Grand Cayman (KY)

( * ) Notice: Subject to any disclaimer, the term of this patent is extended or adjusted under 35 U.S.C. 154(b) by 0 days.

(21) Appl. No.: 16/001,581

(22) Filed: Jun. 6, 2018

(65) Prior Publication Data

US 2018/0348428 A1  Dec. 6, 2018

Related U.S. Application Data

(60) Provisional application No. 62/603,616, filed on Jun. 6, 2017.

(51) Int. Cl.
*G02B 6/12* (2006.01)
*G02B 6/30* (2006.01)
*G02B 6/27* (2006.01)
*G02B 6/42* (2006.01)

(52) U.S. Cl.
CPC ....... *G02B 6/12004* (2013.01); *G02B 6/2706* (2013.01); *G02B 6/30* (2013.01); *G02B 6/4275* (2013.01); *G02B 2006/12061* (2013.01); *G02B 2006/12123* (2013.01)

(58) Field of Classification Search
CPC .... G02B 6/12004; G02B 6/2706; G02B 6/30; G02B 6/4275; G02B 2006/12061; G02B 2006/12123; H01L 27/0248; H01L 27/0255; H01L 25/167; H03F 1/52
USPC .............................. 385/14; 257/99, 367, 438
See application file for complete search history.

(56) References Cited

U.S. PATENT DOCUMENTS

| | | | | |
|---|---|---|---|---|
| 5,578,860 A | * | 11/1996 | Costa | H01L 27/0251 257/362 |
| 9,726,841 B1 | * | 8/2017 | Lin | G02B 6/4275 |
| 9,953,968 B2 | * | 4/2018 | Cao | H01L 27/0255 |
| 2004/0027744 A1 | * | 2/2004 | Liu | H01L 27/0262 361/56 |
| 2004/0140849 A1 | * | 7/2004 | Ikeda | H03F 1/52 330/110 |
| 2006/0071229 A1 | * | 4/2006 | Guenter | H01L 25/167 257/99 |

(Continued)

FOREIGN PATENT DOCUMENTS

CA  207426398  *  5/2018  ............... G02B 6/42

*Primary Examiner* — Akm E Ullah
(74) *Attorney, Agent, or Firm* — Han IP PLLC; Andy M. Han (57) ABSTRACT

Various embodiments of a photonic integrated circuit (PIC) are described herein. A PIC, functioning as a coherent receiver, may include optical components such as an optical coupler, a directional coupler, a beam splitter, a polarizing beam rotator-splitter, a variable optical attenuator, a monitor photodiode, 90-degree hybrid mixer, and a waveguide photodiode. The PIC may also include electrical components such as an electrode, a capacitor, a resistor and a Zener diode.

7 Claims, 6 Drawing Sheets

(56) References Cited

U.S. PATENT DOCUMENTS

| | | | | |
|---|---|---|---|---|
| 2006/0118877 A1* | 6/2006 | Tatum | ............... | H01S 5/0261 257/367 |
| 2006/0291114 A1* | 12/2006 | Teo | ............... | H03F 1/08 361/56 |
| 2008/0029782 A1* | 2/2008 | Carpenter | ............... | H01L 27/0255 257/173 |
| 2009/0189182 A1* | 7/2009 | Hodel | ............... | H01L 23/60 257/173 |
| 2009/0267232 A1* | 10/2009 | Morel | ............... | H01L 21/486 257/758 |
| 2009/0283848 A1* | 11/2009 | Tan | ............... | H01L 27/0248 257/438 |
| 2010/0085672 A1* | 4/2010 | Savin | ............... | H01L 27/0255 361/56 |
| 2012/0086081 A1* | 4/2012 | Moriwaki | ............... | H01L 27/0255 257/355 |
| 2014/0286085 A1* | 9/2014 | Miyakawa | ............... | G11C 11/1695 365/158 |
| 2015/0364462 A1* | 12/2015 | Nakaiso | ............... | H01L 27/0814 257/751 |

\* cited by examiner

SILICON PHOTONIC INTEGRATED CIRCUIT WITH ELECTROSTATIC DISCHARGE PROTECTION MECHANISM FOR STATIC ELECTRIC SHOCKS

CROSS-REFERENCE TO RELATED PATENT APPLICATIONS

The present disclosure claims the priority benefit of U.S. Patent Application No. 62/603,616, filed on Jun. 6, 2017. The aforementioned application is incorporated by reference in its entirety.

TECHNICAL FIELD

The present disclosure relates to a photonic integrated circuit (PIC). More particularly, the present disclosure relates to a PIC having an integrated bias that has an electrostatic discharge (ESD) protection mechanism.

BACKGROUND

Photonic integrated circuits and systems, commonly referred as "integrated photonics", involve fabricating both optical devices and electrical devices on a same substrate, usually a semiconductor substrate. Using similar semiconductor fabrication techniques employed in manufacturing integrated circuits (ICs), one is able to integrate, on a same semiconductor substrate, miniaturized optical components together with electrical components to perform signal processing or other circuit functions in both optical and electrical domains. For example, a coherent receiver commonly used for telecommunication may be realized by miniaturized optical components (such as waveguides, photodiodes, optical couplers, polarizers, beam splitters, optical mixers, and the like) integrated with miniaturized electrical components (such as resistors, capacitors, diodes, electrodes, and the like). Due to the miniaturized physical nature of the optical and electrical components, PICs and systems are vulnerable to static electric shocks in the environment just like electronic integrated circuits does. That is, an ESD incident happening on a PIC may easily "burn the chip", or destroy the PIC physically due to a sudden high current flowing through the PIC. Therefore, it is essential to provide ESD protection mechanisms to protect a PIC in an event of an ESD incident.

SUMMARY

This section highlights certain features of the inventive concept of the present disclosure, and in no way is to be interpreted as limiting the scope of the claimed subject matter as well as any deviations and derivatives thereof.

In one aspect, an integrated bias circuit may include the following: a first ground pad, a second ground pad, a signal pad disposed between the first and second ground pads, a bias pad, a third ground pad electrically connected to each of the first and second ground pads, a photodiode having a first anode electrically connected to the signal pad and a first cathode electrically connected to a first cathode electrode, a first capacitor electrically connected between the first cathode electrode and the first ground pad, a second capacitor electrically connected between the first cathode electrode and the second ground pad, and a Zener diode having a second anode electrically connected to the third ground pad and a second cathode electrically connected to the bias pad. The first cathode electrode and the bias pad form a function path for a bias signal at the bias pad to arrive at the first cathode.

In another aspect, a photonic integrated circuit may include the following: a first optical coupler, a second optical coupler, a polarizing beam rotator-splitter connected to the first optical coupler, a beam splitter connected to the second optical coupler, a first directional coupler connecting an output of the polarizing beam rotator-splitter to a first variable optical attenuator, a second directional coupler connecting an output of the beam splitter to a second variable optical attenuator, a first 90-degree hybrid mixer generating four predefined beat phase offsets based on an output of the first variable optical attenuator and an output of the beam splitter, a second 90-degree hybrid mixer generating four predefined beat phase offsets based on an output of the second variable optical attenuator and an output of the polarizing beam rotator-splitter, and eight integrated bias circuits to convert the outputs of the first and second 90-degree hybrid mixers from optical domain to electrical domain.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Example Embodiments

Figure 1:
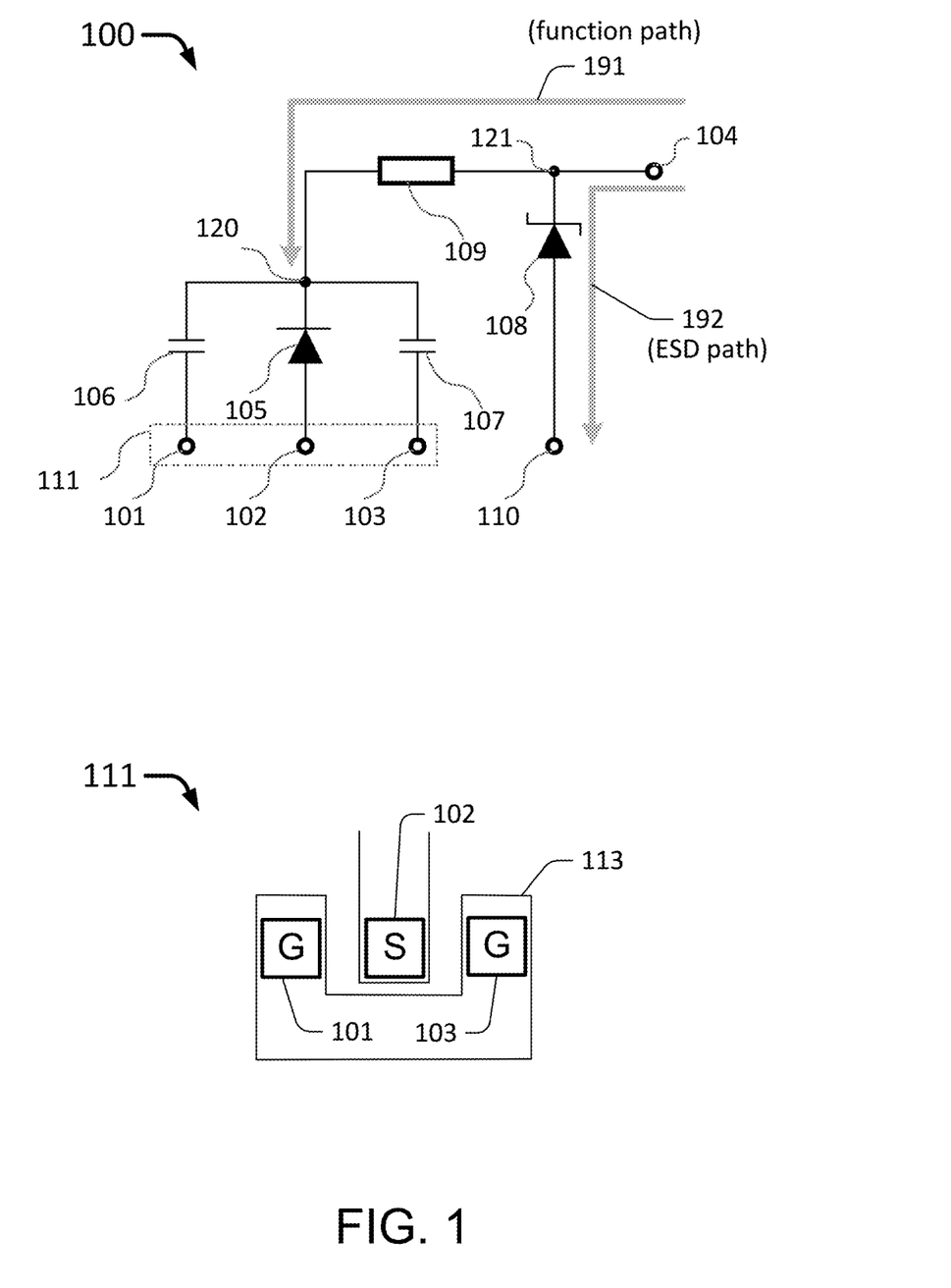
FIG. 1 is a schematic diagram of an integrated bias circuit in accordance with an embodiment of the present disclosure.

FIG. 1 illustrates a schematic diagram of an integrated bias circuit 100 in accordance with an embodiment of the present disclosure. Integrated bias circuit 100 may be fabricated on a silicon-on-insulator (SOI) substrate that is commonly employed for integrated photonics, possibly using semiconductor processing techniques similar to those employed in the IC industry. Referring to FIG. 1, integrated bias circuit 100 may include a ground-signal-ground (GSG) electrode 111, which has two ground pads 101 and 103 as well as a signal pad 102. Each of ground pads 101 and 103 is electrically connected to an electric ground of integrated bias circuit 100. In some embodiments, ground pads 101 and 103 may be physically connected to one another by a common ground frame 113 which is electrically conductive. Signal pad 102 is electrically separated from ground pads 101 and 103. Integrated bias circuit 100 may also include a bias pad 104 for receiving a bias signal, and a third ground pad 110 that is electrically connected with ground pads 101 and 103, although ground pad 110 may or may not physically share the common ground frame as ground pads 101 and 103.

Integrated bias circuit 100 may also include some passive electrical and electro-optical components. For example, as shown in FIG. 1, integrated bias circuit 100 may include a photodiode 105. Photodiode 105 may have two electrical terminals, an anode and a cathode. The anode of photodiode 105 may be electrically connected to signal pad 102, and the cathode of photodiode 105 may be electrically connected to a first cathode electrode 120. First cathode electrode 120 and bias pad 104 collectively form a function path 191 of integrated bias circuit 100. Function path 191 defines an electrical route via which an electrical signal, such as a bias signal presented at bias pad 104, may go when integrated bias circuit 100 is functioning in a normal working mode (as opposed to an abnormal mode, such as a mode in which integrated bias circuit 100 is subject to an ESD incident). Namely, when integrated bias circuit 100 is working in the normal working mode, first cathode electrode 120 and bias pad 104 may form function path 191 for the bias signal presented at bias pad 104 to "arrive at", or electrically connected to, the cathode of photodiode 105 via function path 191.

In some embodiments, as shown in FIG. 1, integrated bias circuit 100 may further include a resistor 109 that is electrically connected between first cathode electrode 120 and bias pad 104. Function path 191 may thus include resistor 109. That is, first cathode electrode 120 and bias pad 104 form function path 191 of integrated bias circuit 100 along with resistor 109. The bias signal presented at bias pad 104 may travel through bias pad 104, resistor 109 and first cathode electrode 120 in sequence and arrive at the cathode of photodiode 105.

Integrated bias circuit 100 may also include capacitors 106 and 107. Capacitor 106 may be electrically connected between first cathode electrode 120 and ground pad 101, whereas capacitor 107 may be electrically connected between first cathode electrode 120 and ground pad 103. Each of capacitors 106 and 107 may be an integrated on-chip capacitor. That is, each of capacitors 106 and 107 may be an on-chip capacitor that is integrated on the SOI substrate. In some embodiments, each of capacitors 106 and 107 may be a metal-metal capacitor, having a structure of a dielectric layer sandwiched between two metal plates.

Integrated bias circuit 100 may further include a Zener diode 108 that is electrically connected between bias pad 104 and third ground pad 110. Specifically, Zener diode 108 may have two electrical terminals, an anode and a cathode. The anode of Zener diode 108 may be electrically connected to third ground pad 110, and the cathode of Zener diode 108 may be electrically connected to a second cathode electrode 121 that is electrically connected to bias pad 104.

Bias pad 104 and Zener diode 108 collectively form an ESD path 192 as shown in FIG. 1. ESD path is not active when integrated bias circuit 100 is working in a normal working mode. However, when an ESD incident strikes integrated bias circuit 100, ESD path 192 provides a low-impedance route to bypass a massive ESD current from bias pad 104 through Zener diode 108 and third ground pad 110 to the electrical ground of integrated bias circuit 100, thereby protecting other electrical and electro-optical components of integrated bias circuit 100 such as photodiode 105, resistor 109 and capacitors 106 and 107. To achieve this purpose and enable ESD path 192 in an event of the ESD incident, a breakdown voltage of Zener diode 108, with respect to a breakdown voltage of photodiode 105, may be appropriately designed or selected. For example, if photodiode 105 has a breakdown voltage higher than 10 volts, the breakdown voltage of Zener diode 108 may be designed to be slightly lower than the breakdown voltage of photodiode 105 for ESD path 192 to be functional in an ESD event.

Figure 2:
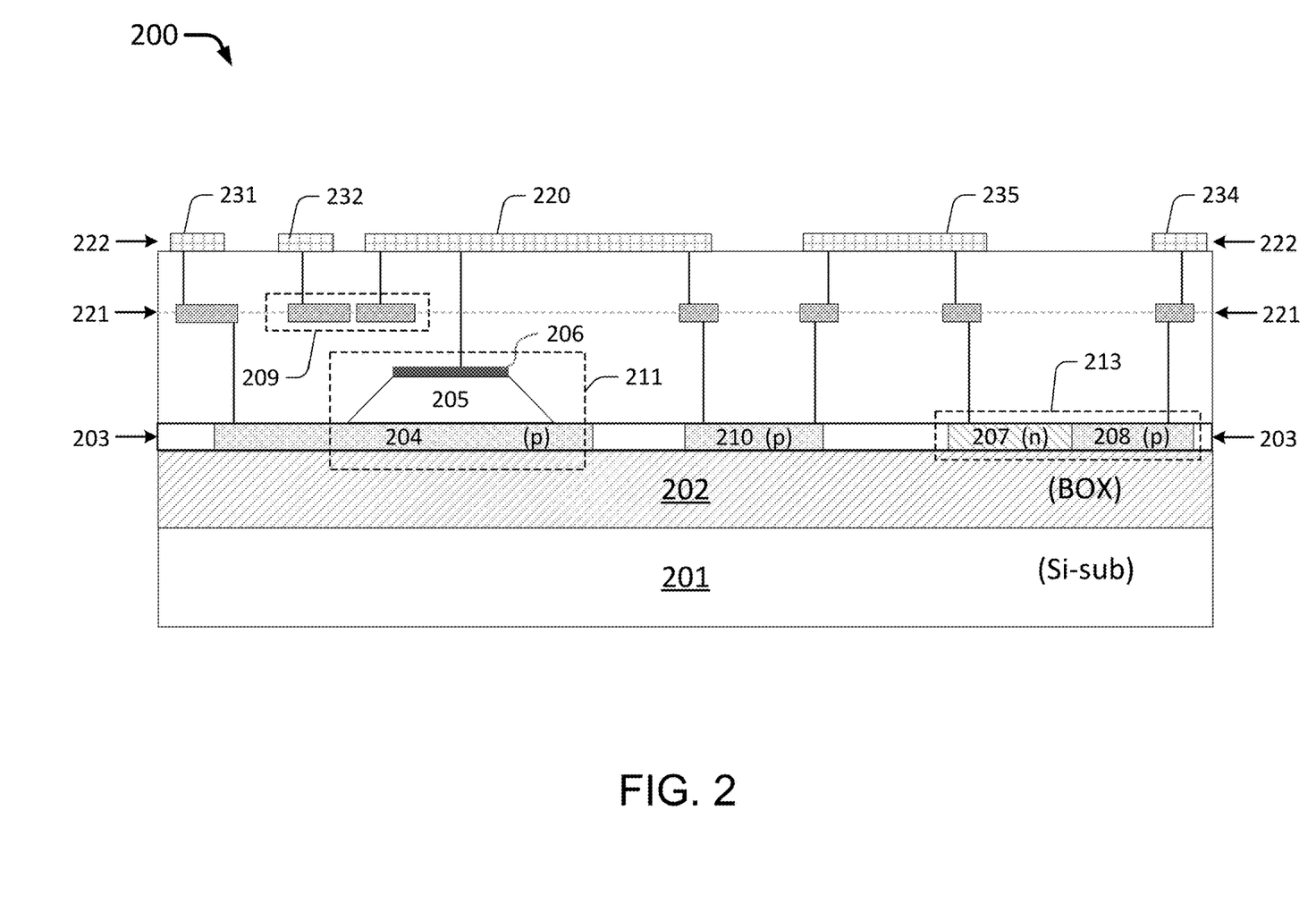
FIG. 2 illustrates a physical realization of the integrated bias circuit of FIG. 1 in accordance with an embodiment of the present disclosure.

FIG. 2 illustrates a physical realization 200 of integrated bias circuit 100 of FIG. 1 in accordance with an embodiment of the present disclosure. As mentioned above, integrated bias circuit 100 may be fabricated on a SOI substrate, which may include a silicon substrate 201 (labeled as "Si-sub" in FIG. 2), a buried oxide layer 202 (labeled as "BOX" in FIG. 2) and a top silicon layer 203. Buried oxide layer 202 may be sandwiched between silicon substrate 201 and top silicon layer 203. Physical realization 200 may also include a first metal layer 221 and a second metal layer 222.

Photodiode 105 of FIG. 1 may be realized by a germanium-on-silicon (Ge-on-Si) photodiode 211 of FIG. 2. Photodiode 211 may include a p-type doped region 204 of top silicon layer 203, an epitaxy germanium layer 205 disposed on top of p-type doped region 204, and an n-type doped region 206 of epitaxy germanium layer 205, wherein p-type doped region 204 and n-type doped region 206 are an anode and a cathode of photodiode 211, respectively. Using one or more vertical electrical connections connecting top silicon layer 203 to first metal layer 221 and one or more vertical electrical connections connecting first metal layer 221 to second metal layer 222, the anode of photodiode 211 (embodied by p-type doped region 204) may be electrically connected to electrode 231 located on second metal layer 222, whereas electrode 231 may correspond to signal pad 102 of FIG. 1. Similarly, the cathode of photodiode 211 (embodied by n-type doped region 206) may be electrically connected to electrode 220 located on second metal layer 222, whereas electrode 220 may correspond to first cathode electrode 120 of FIG. 1.

Zener diode 108 of FIG. 1 may be realized by a p-n junction diode 213 of FIG. 2. Diode 213 may include a p-type doped region 208 of top silicon layer 203 and an n-type doped region 207 of top silicon layer 203, wherein p-type doped region 208 and n-type doped region 207 are an anode and a cathode of diode 213, respectively. Using one or more vertical electrical connections connecting top silicon layer 203 to first metal layer 221 and one or more vertical electrical connections connecting first metal layer 221 to second metal layer 222, the anode of diode 213 (embodied by p-type doped region 208) may be electrically connected to electrode 234 located on second metal layer 222, whereas electrode 234 may correspond to third ground pad 110 of FIG. 1. Similarly, the cathode of diode 213 (embodied by n-type doped region 207) may be electrically connected to electrode 235 located on second metal layer 222, whereas electrode 235 may correspond to second cathode electrode 121 of FIG. 1.

Each of capacitors 106 and 107 of FIG. 1 may be realized by a metal-metal capacitor 209 of FIG. 2. Metal-metal capacitor 209 may include two pieces of metal pattern that are closely spaced on first metal layer 221, each piece corresponding to a respective one of the two terminals of capacitor 209. One piece of metal pattern of capacitor 209 may be electrically connected to electrode 220, whereas the other piece of metal pattern of capacitor 209 may be electrically connected to an electrode 232 located on second metal layer 222. Electrode 232 may be corresponding to either of ground pads 101 and 103 of FIG. 1.

In some embodiments, resistor 109 of FIG. 1 may be realized by a piece of p-type doped region 210 of top silicon layer 203. The two ends of p-type doped region 210 respectively correspond to the two terminals of resistor 109, and are electrically connected to electrode 220 and electrode 235, respectively.

Figure 3A:
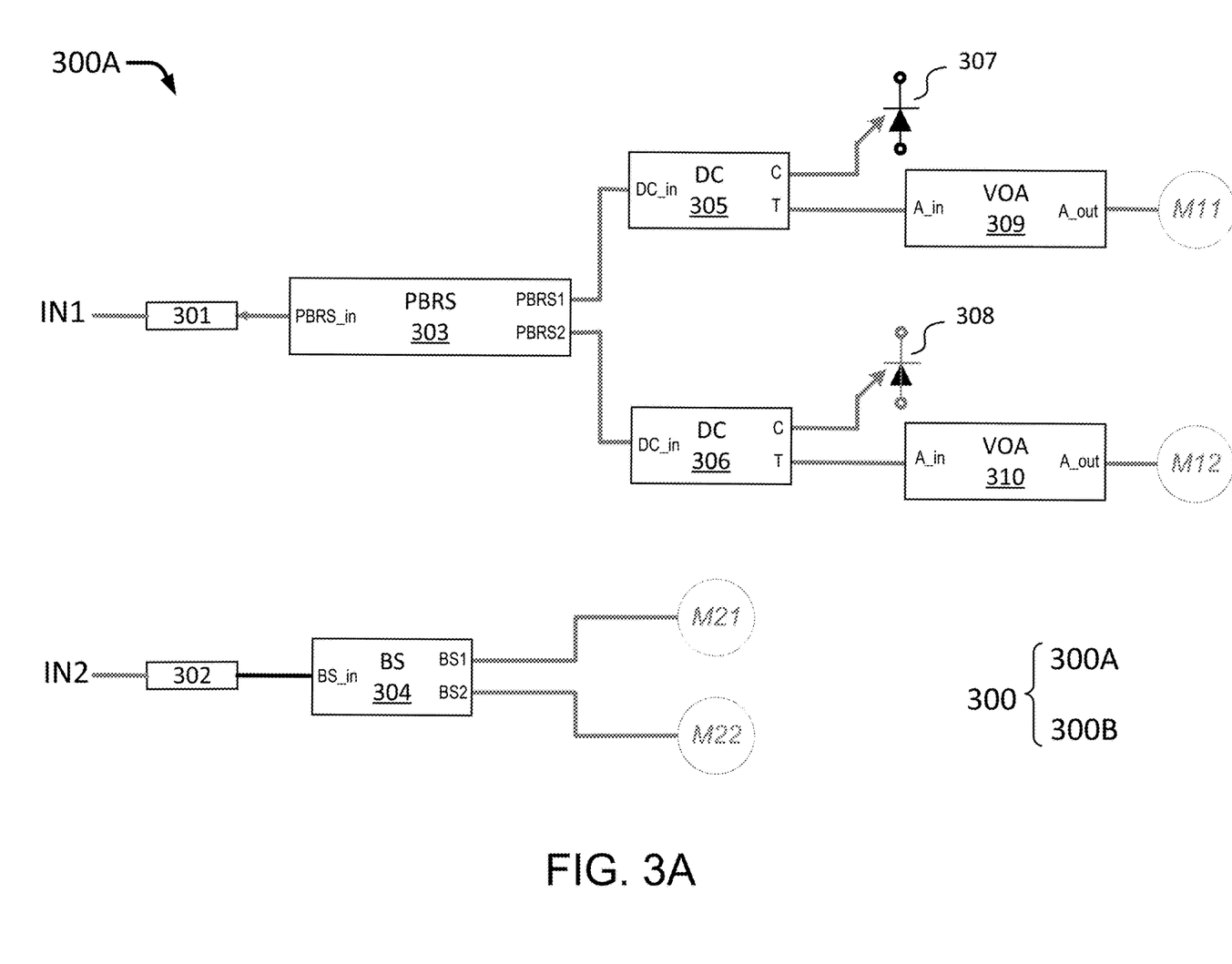
FIG. 3A and FIG. 3B combined show a schematic diagram of a silicon photonic integrated circuit in accordance with an embodiment of the present disclosure.
Figure 3B:
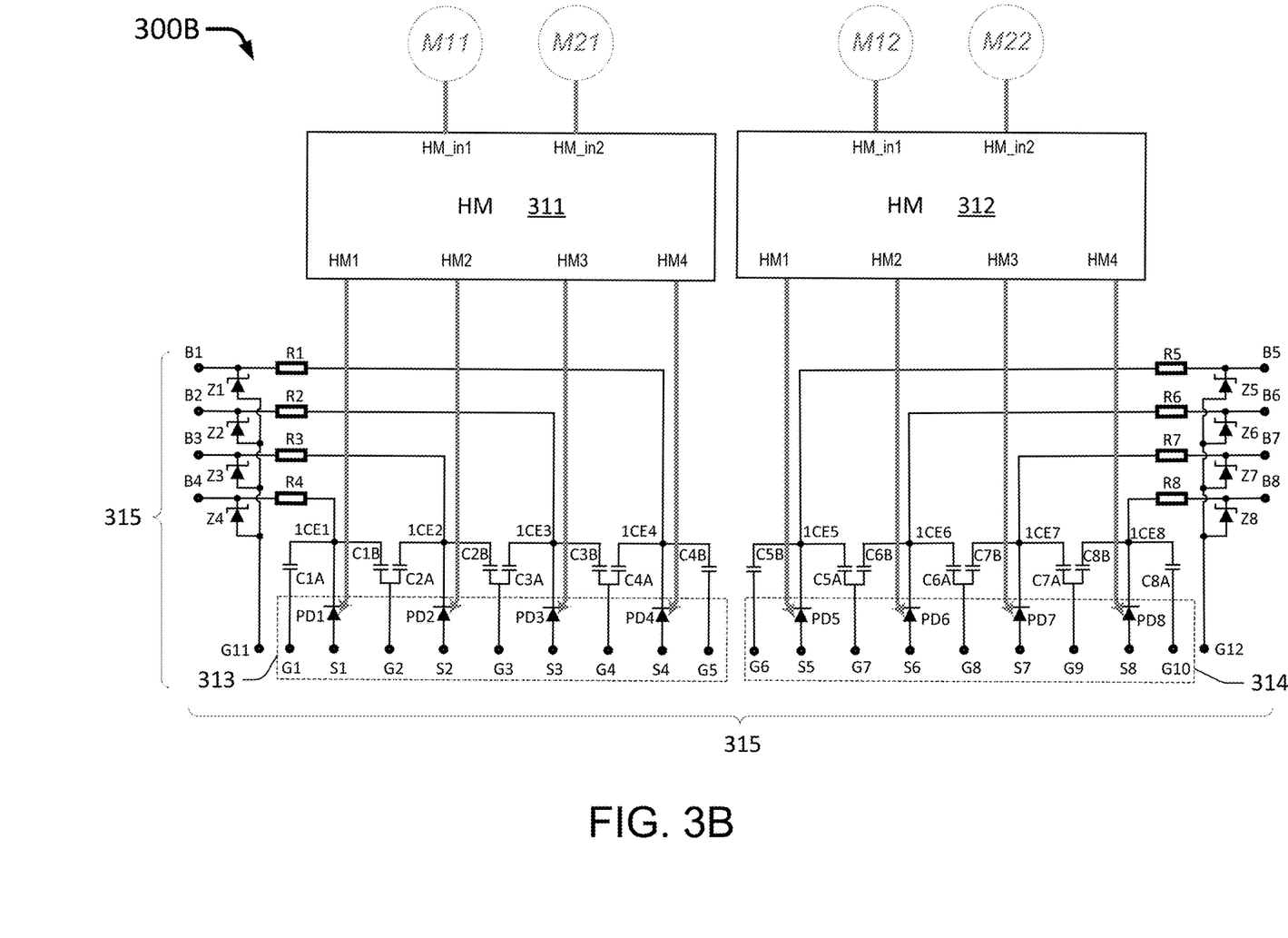

FIG. 3A and FIG. 3B combined show a schematic diagram of a silicon photonic integrated circuit, coherent receiver 300, in accordance with an embodiment of the present disclosure. FIG. 3A shows a schematic diagram of a first portion 300A of coherent receiver 300, whereas FIG. 3B shows a schematic diagram of a second portion 300B of coherent receiver 300. Schematic diagrams of FIG. 3A and FIG. 3B are merged at schematic merging circles M11, M12, M21 and M22 to form a full schematic diagram of coherent receiver 300.

As shown in FIG. 3A and FIG. 3B combined, coherent receiver 300 may include various optical, electrical and electro-optical components or functional blocks that are interconnected via optical connections and electrical connections. An electrical connection or coupling that connects two components of coherent receiver 300 may be realized by one or more electrically conducting pieces of material, or wires, connecting the two components, with an electrical signal traveling the electrical connection. An optical connection or coupling that connects two components of coherent receiver 300 may be realized by one or more optical waveguides connecting the two components, with an optical signal traveling the optical connection. All parts of coherent receiver 300, including optical/electrical components and connections, may be realized or otherwise fabricated on a SOI substrate such as the SOI substrate of FIG. 2.

As shown in FIG. 3A, coherent receiver 300 may have two inputs (labeled as IN1 and IN2 in FIG. 3A). Coherent receiver 300 may include two optical couplers 301 and 302. Each of the two inputs of coherent receiver 300 may feed into a respective one of optical coupler 301 and optical coupler 302. In some embodiments, each of optical couplers 301 and 302 may be an edge coupler that has a mode-size converter.

Coherent receiver 300 may also include a polarizing beam rotator-splitter (PBRS) 303. PBRS 303 may have a PBRS input (labeled as PBRS_in in FIG. 3A) and two PBRS outputs (labeled as PBRS1 and PBRS2, respectively, in FIG. 3A). Optical coupler 301 may be optically connected to PBRS 303 via the PBRS input of PBRS 303. PBRS 303 is illustrated in further details in FIG. 4.

Figure 4:
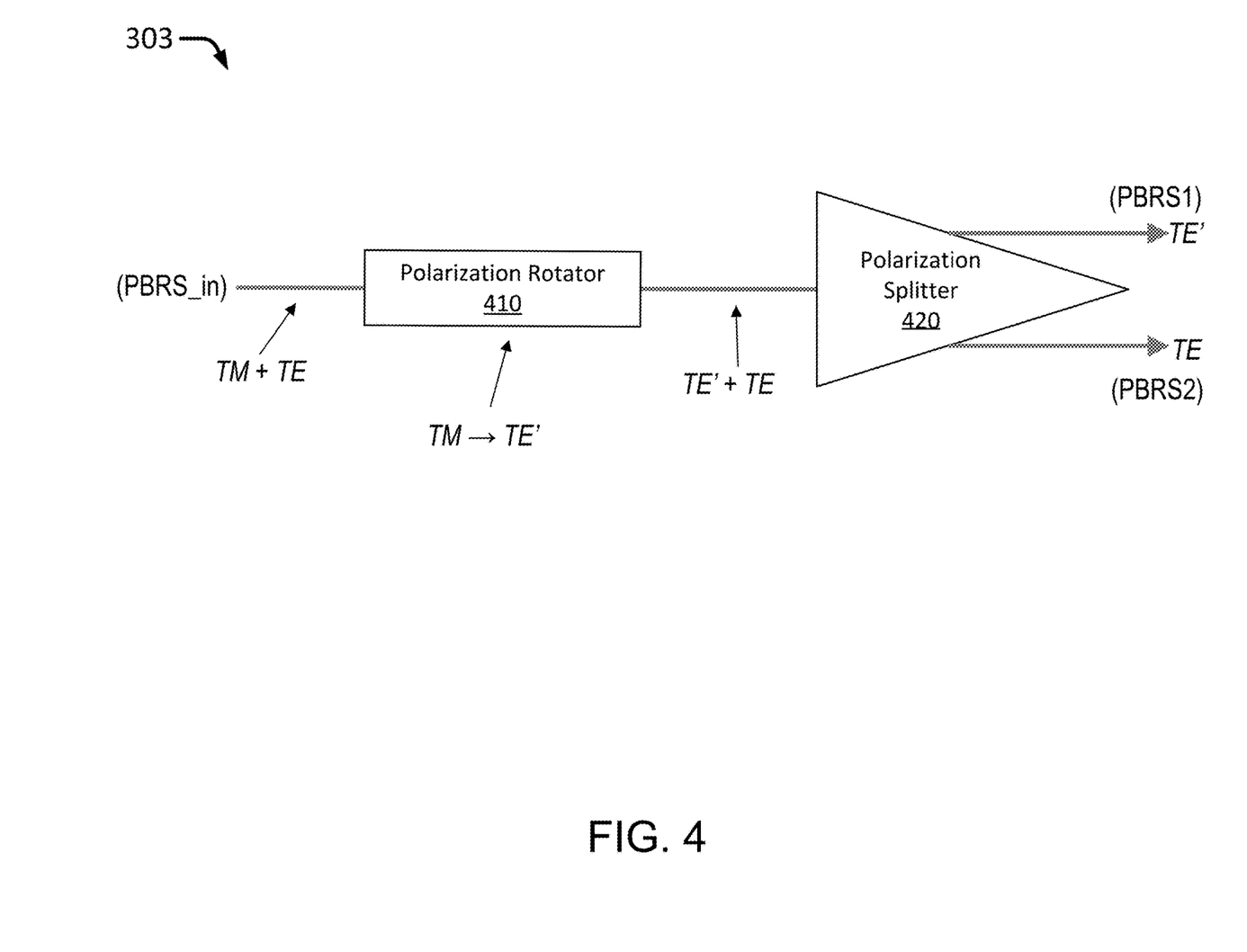
FIG. 4 illustrates details of a polarizing beam rotator-splitter of FIG. 3A.

As shown in FIG. 4, PBRS 303 of FIG. 3A is an optical functional block having a polarization rotator 410 and a polarization splitter 420 optically connected in a serial connection. A TEM signal, i.e., an optical signal having a transverse electric (TE) component and a transverse magnetic (TM) component superimposed together, may be present at the PBRS input of PBRS 303. As the TEM signal travels through polarization rotator 410, polarization rotator 410 may rotate the TM component of the TEM signal into a TE component (labeled as TE' in FIG. 4) while keeping the TE component thereof intact. The TE component may now become superimposed with the TE' component when leaving polarization rotator 410 and arriving at polarization splitter 420. Subsequently, polarization splitter 420 may separate the TE component and the TE' component, and send the TE component and the TE' component to a respective output of PBRS 303 (labeled as PBRS1 and PBRS2, respectively, in FIG. 3A and FIG. 4).

Referring again to FIG. 3A, coherent receiver 300 may also include a beam splitter (BS) 304. BS 304 may have a BS input (labeled as BS_in in FIG. 3A) and two BS outputs (labeled as BS1 and BS2, respectively, in FIG. 3A). BS 304 is capable of splitting an input optical signal received at BS_in into two identical optical signals each having substantially half of the power of the input optical signal, and subsequently sending the two identical optical signals to the two BS outputs. Coherent receiver 300 may have optical coupler 302 optically connected to BS 304 at the BS input. In FIG. 3A, the two BS outputs of BS 304 are labeled with schematic merging circles M21 and M22, respectively, and are optically connected to other optical components of coherent receiver 300 as shown in FIG. 3B.

In addition, coherent receiver 300 may have two directional couplers (DCs), DC 305 and DC 306. Each of DC 305 and DC 306 may have a DC input (labeled as DC_in in FIG. 3A), a through output (labeled as T in FIG. 3A), as well as a cross output (labeled as C in FIG. 3A). The two PBRS outputs of PBRS 303 may be optically connected to the DC input of DC 305 and the DC input of DC 306, respectively. Moreover, coherent receiver 300 may also include monitor photodiodes (MPDs) 307 and 308, as shown in FIG. 3A. Each of MPD 307 and MPD 308 may be optically connected to the cross output of DC 305 and the cross output of DC 306, respectively, for respectively monitoring optical signals at the two PBRS outputs of PBRS 303.

Coherent receiver 300 may also include two variable optical attenuators (VOAs), i.e., VOA 309 and VOA 310, as shown in FIG. 3A. Each of VOA 309 and VOA 310 may have a VOA input (labeled as A_in in FIG. 3A) and a VOA output (labeled as A_out in FIG. 3A). The VOA input of VOA 309 may be optically connected to the through output of DC 305, whereas the VOA input of VOA 310 may be optically connected to the through output of DC 306. In FIG. 3A, the VOA output of VOA 309 is labeled with schematic merging circle M11, and is optically connected to another optical component of coherent receiver 300, which is shown in FIG. 3B. Similarly, the VOA output of VOA 310 is labeled with schematic merging circle M12, and is optically connected to another optical component of coherent receiver 300, which is also shown in FIG. 3B. In some embodiments, VOA 309 may be electrically connected to VOA 310 in a serial connection. That is, VOA 309 and VOA 310 may be connected in series, with a voltage applied across the serial connection of VOA 309 and VOA 310 to bias each of VOA 309 and VOA 310.

Referring to FIG. 3B, coherent receiver 300 may include two 90-degree hybrid mixers (HMs), HM 311 and HM 312. Each of HM 311 and HM 312 may have two HM inputs (respectively labeled as HM_in1 and HM_in2 in FIG. 3B) and four HM outputs (respectively labeled as HM1, HM2, HM3 and HM4 in FIG. 3B). The two HM inputs of HM 311 may be optically connected to the VOA output of VOA 309 and one BS output of BS 304. The two HM inputs of HM 312 may be optically connected to the VOA output of VOA 310 and the other BS output of BS 304. Function-wise, HM 311 is capable of generating four respectively different beat phase offsets based on the VOA output of VOA 309 and the one BS output of BS 304. Similarly, HM 312 is capable of generating four respectively different beat phase offsets based on the VOA output of VOA 310 and the other BS output of BS 304. The four different beat phase offsets generated by either HM 311 or HM 312 have an incremental phase offset difference of 90 degrees. An operational description of a 90-degree HM (e.g., HM 311 and HM312 of FIG. 3B) is further illustrated in FIG. 5.

Figure 5:
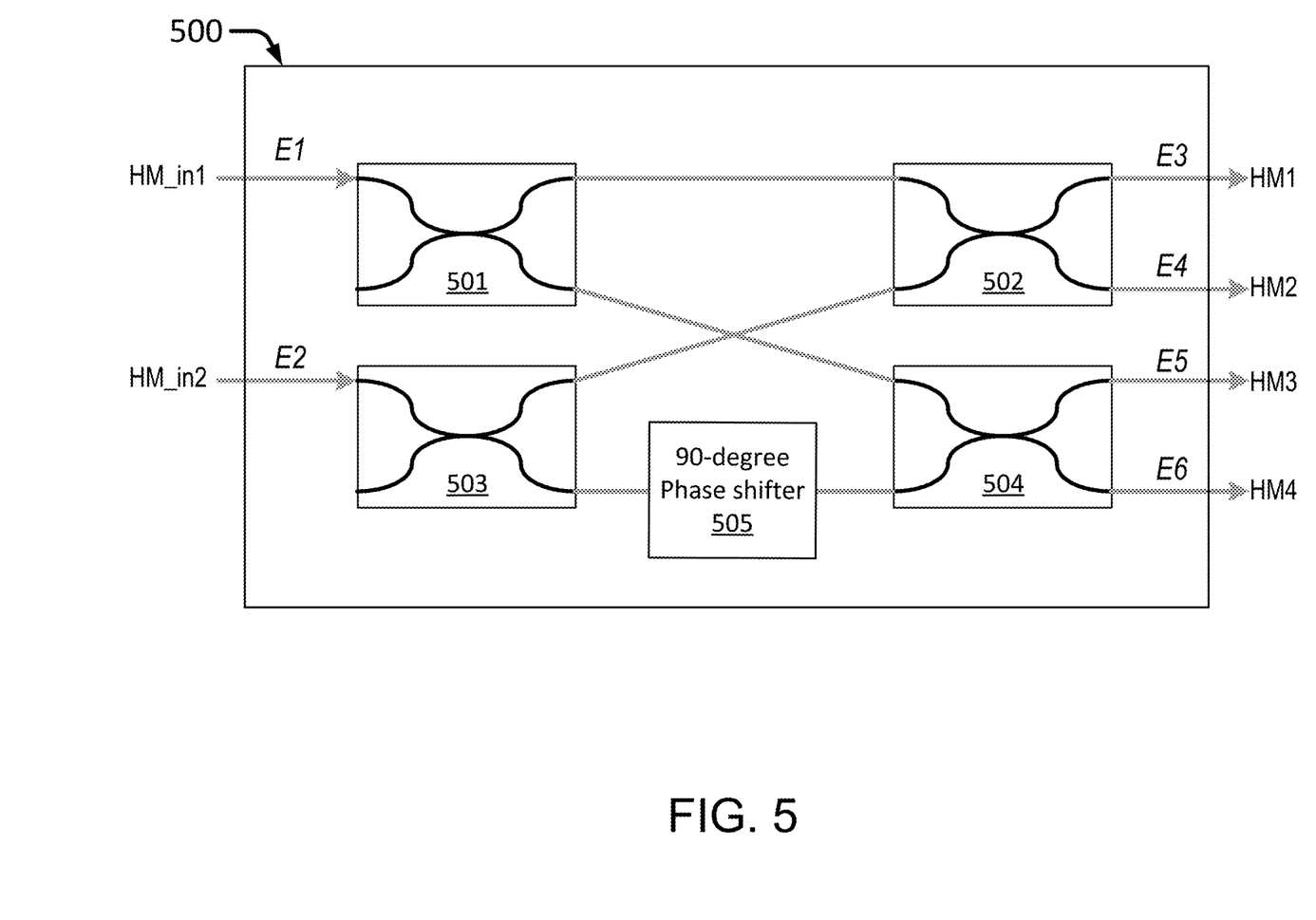
FIG. 5 illustrates details of a 90-degree hybrid mixer of FIG. 3B

As shown in FIG. 5, a 90-degree HM 500 may include four 3-dB couplers 501, 502, 503 and 504, as well as a 90-degree phase shifter 505. Similar to HM 311 and HM 312 of FIG. 3B, HM 500 of FIG. 5 may have two HM inputs (respectively labeled as HM_in1 and HM_in2 in FIG. 5) and four HM outputs (respectively labeled as HM1, HM2, HM3 and HM4 in FIG. 5). Let E1, E2, E3, E4, E5 and E6 be an optical signal on HM_in1, HM_in2, HM1, HM2, HM3 and HM4 of HM 500, respectively. The following equations may constitute an operational description of HM 500:

$$E3=E1-E2;$$

$$E4=E1+E2;$$

$$E5=E1-jE2;$$

$$E6=E1+jE2.$$

Namely, each of E3, E4, E5 and E6 is a predefined beat phase offset based on E1 and E2. Specifically, E3 is a predefined beat phase offset of 180 degrees based on E1 and E2; E4 is a predefined beat phase offset of 0 degrees based on E1 and E2; E5 is a predefined beat phase offset of −90 degrees based on E1 and E2; and E6 is a predefined beat phase offset of 90 degrees based on E1 and E2. Accordingly, HM 311 of FIG. 3B may generate predefined beat phase offsets of 0 degrees, 180 degrees, 90 degrees and −90 degrees based on the VOA output of VOA 309 and a BS output of BS 304. Similarly, HM 312 of FIG. 3B may generate predefined beat phase offsets of 0 degrees, 180 degrees, 90 degrees and −90 degrees based on the VOA output of VOA 310 and the other BS output of BS 304.

Referring to FIG. 3B again, coherent receiver 300 may also include two quad-channel waveguide photodiode (WGPD) arrays 313 and 314. WGPD array 313 and WGPD array 314 each may have four WGPDs. As shown in FIG. 3B, WGPD array 313 may have WGPDs PD1, PD2, PD3 and PD4, whereas WGPD array 314 may have WGPDs PD5, PD6, PD7 and PD8. Each of WGPDs PD1, PD2, PD3 and PD4 may be optically connected to a respective one of the four HM outputs of HM 311, whereas each of WGPDs PD5, PD6, PD7 and PD8 may be optically connected to a respective one of the four HM outputs of HM 312. Therefore, an optical signal from HM 311 or HM 312 that is connected to one of WGPDs PD1-PD8 may be converted by the respective WGPD to an electrical signal representing a respective one of predefined beat phase offsets of 0 degrees, 180 degrees, 90 degrees and −90 degrees generated by HM 311 or HM 312. That is, each of WGPDs PD1, PD2, PD3 and PD4 may be capable of obtaining a respective one of predefined beat phase offsets of 0 degrees, 180 degrees, 90 degrees and −90 degrees generated by HM 311 based on the VOA output of VOA 309 and a BS output of BS 304. Similarly, each of WGPDs PD5, PD6, PD7 and PD8 may be capable of obtaining a respective one of predefined beat phase offsets of 0 degrees, 180 degrees, 90 degrees and −90 degrees generated by HM 312 based on the VOA output of VOA 310 and a BS output of BS 304. In some embodiments, each of WGPDs PD1-PD8 may be a Ge-on-Si photodiode.

As shown in FIG. 3B, coherent receiver 300 may further include an eight-channel bias circuit array 315. Eight-channel bias circuit array 315 may include eight integrated bias circuits, and each of the eight integrated bias circuits may include a respective one of the WGPDs PD1-PD8. Namely, each of the eight integrated bias circuits may be implemented by integrated bias circuit 100 of FIG. 1 and realized on a SOI substrate as illustrated by realization 200 of FIG. 2.

Eight-channel bias circuit array 315 of FIG. 3B may be an implementation of eight integrated bias circuit 100 of FIG. 1. Specifically, each of Zener diodes Z1, Z2, Z3, Z4, Z5, Z6, Z7 and Z8 of FIG. 3B may correspond to Zener diode 108 of FIG. 1. Each of resistors R1, R2, R3, R4, R5, R6, R7 and R8 of FIG. 3B may correspond to resistor 109 of FIG. 1. Each of capacitor C1A, C2A, C3A, C4A, C5A, C6A, C7A and C8A of FIG. 3B may correspond to capacitor 106 of FIG. 1. Each of capacitor C1B, C2B, C3B, C4B, C5B, C6B, C7B and C8B of FIG. 3B may correspond to capacitor 107 of FIG. 1. Each of WGPDs PD1, PD2, PD3, PD4, PD5, PD6, PD7 and PD8 of FIG. 3B may correspond to PD 105 of FIG. 1. Each of signal pads S1, S2, S3, S4, S5, S6, S7 and S8 of FIG. 3B may correspond to signal pad 102 of FIG. 1. Each of bias pads B1, B2, B3, B4, B5, B6, B7 and B8 of FIG. 3B may correspond to bias pad 104 of FIG. 1. Each of ground pad G11 and G12 may correspond to ground pad 110 of FIG. 1. Each of first cathode electrodes 10E1, 10E2, 10E3, 10E4, 10E5, 10E6, 10E7 and 10E8 of FIG. 3B may correspond to first cathode electrode 120 of FIG. 1.

As shown in FIG. 3B, each of WGPD arrays 313 and 314 may have a ground-signal-ground-signal-ground-signal-ground-signal-ground (GSGSGSGSG) electrode. Specifically, the GSGSGSGSG electrode of WGPD array 313 may include ground pads G1-G5 and signal pads S1-S4, wherein S1 is physically disposed between G1 and G2, S2 between G2 and G3, S3 between G3 and G4, S4 between G4 and G5, respectively. Note that ground pads G1, G2, G3, G4 and G5 may be electrically connected together, and in some embodiments may share a common ground frame. Signal pads S1, S2, S3 and S4, on the other hand, may be electrically isolated from each other.

Similarly, the GSGSGSGSG electrode of WGPD array 314 may include ground pads G6-G10 and signal pads S5-S8, wherein S5 is physically disposed between G6 and G7, S6 between G7 and G8, S7 between G8 and G9, S8 between G9 and G10, respectively. Note that ground pads G6, G7, G8, G9 and G10 may be electrically connected together, and in some embodiments may share a common ground frame. Signal pads S1, S2, S3 and S4, on the other hand, may be electrically isolated from each other. Signal pads S5, S6, S7 and S8, on the other hand, may be electrically isolated from each other Highlight of Select Features In one aspect, an integrated bias circuit may include the following: a first ground pad, a second ground pad, a signal pad disposed between the first and second ground pads, a bias pad, a third ground pad electrically connected to each of the first and second ground pads, a photodiode having a first anode electrically connected to the signal pad and a first cathode electrically connected to a first cathode electrode, a first capacitor electrically connected between the first cathode electrode and the first ground pad, a second capacitor electrically connected between the first cathode electrode and the second ground pad, and a Zener diode having a second anode electrically connected to the third ground pad and a second cathode electrically connected to the bias pad. The first cathode electrode and the bias pad may form a function path for a bias signal at the bias pad to arrive at the first cathode.

In some embodiments, the integrated bias circuit may be fabricated on a silicon-on-insulator substrate.

In some embodiments, the silicon-on-insulator substrate may have a top silicon layer, and the Zener diode may be fabricated on the top silicon layer.

In some embodiments, wherein the photodiode may be a germanium-on-silicon photodiode.

In some embodiments, each of the first and second capacitors may be a metal-metal capacitor.

In some embodiments, the integrated bias circuit may further include a resistor electrically connected between the first cathode electrode and the bias pad, wherein the first cathode electrode and the bias pad may form the function path along with the resistor.

In some embodiments, the photodiode may have a first breakdown voltage, and the Zener diode may have a second breakdown voltage that is lower than the first breakdown voltage.

In another aspect, a photonic integrated circuit may include the following: a first optical coupler, a second optical coupler, a polarizing beam rotator-splitter connected to the first optical coupler, a beam splitter connected to the second optical coupler, a first directional coupler connecting an output of the polarizing beam rotator-splitter to a first variable optical attenuator, a second directional coupler connecting an output of the beam splitter to a second variable optical attenuator, a first 90-degree hybrid mixer generating four predefined beat phase offsets based on an output of the first variable optical attenuator and an output of the beam splitter, a second 90-degree hybrid mixer generating four predefined beat phase offsets based on an output of the second variable optical attenuator and an output of the polarizing beam rotator-splitter, and eight integrated bias circuits to convert the outputs of the first and second 90-degree hybrid mixers from optical domain to electrical domain.

In some embodiments, each of the eight integrated bias circuits may include first and second capacitors, each of which may be a metal-metal capacitor.

In some embodiments, each of the eight integrated bias circuits may include a Zener diode and a waveguide photodiode. The waveguide photodiode may have a first breakdown voltage, and the Zener diode may have a second breakdown voltage that is lower than the first breakdown voltage. In some embodiments, the waveguide photodiode may be a germanium-on-silicon photodiode.

In some embodiments, the Zener diode may be fabricated on a top silicon layer of a silicon-on-insulator substrate.

In some embodiments, each of the first and second optical couplers may be an edge coupler that also serves as a mode-size converter.

In some embodiments, the first variable optical attenuator may be electrically connected to the second variable optical attenuator in a serial connection.

In some embodiments, the polarizing beam rotator-splitter may have a polarization rotator and a polarization splitter that are optically connected in a serial connection.

ADDITIONAL NOTES

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An integrated bias circuit, comprising:
   a ground-signal-ground (GSG) electrode comprising a first ground pad, a second ground pad and a signal pad disposed between the first and second ground pads;
   a bias pad;
   a third ground pad;
   a photodiode having a first anode and a first cathode, the first anode electrically connected to the signal pad, the first cathode electrically connected to a first cathode electrode, the first cathode electrode and the bias pad forming a function path for a bias signal at the bias pad to arrive at the first cathode;
   a first capacitor electrically connected between the first cathode electrode and the first ground pad;
   a second capacitor electrically connected between the first cathode electrode and the second ground pad; and
   a Zener diode having a second anode and a second cathode, the second anode electrically connected to the third ground pad, the second cathode electrically connected to the bias pad,
   wherein the Zener diode and the bias pad form an electrostatic discharge (ESD) path that is separate from the function path at the bias pad such that;
      during a normal mode the bias signal is electrically connected from the bias pad to the first cathode of the photodiode via the function path, and
      during an ESD incident the ESD path bypasses an ESD current from the bias pad through the Zener diode and the third ground pad to an electrical ground of the integrated bias circuit.

2. The integrated bias circuit of claim 1, wherein the integrated bias circuit is fabricated on a silicon-on-insulator (SOI) substrate.

3. The integrated bias circuit of claim 2, wherein the SOI substrate has a top silicon layer, and wherein the Zener diode is fabricated on the top silicon layer.

4. The integrated bias circuit of claim 1, wherein the photodiode is a germanium-on-silicon (Ge-on-Si) photodiode.

5. The integrated bias circuit of claim 1, wherein each of the first and second capacitors comprises a metal-metal capacitor.

6. The integrated bias circuit of claim 1, further comprising a resistor electrically connected between the first cathode electrode and the bias pad, wherein the first cathode electrode and the bias pad form the function path along with the resistor.

7. The integrated bias circuit of claim 1, wherein the photodiode has a first breakdown voltage, and wherein the Zener diode has a second breakdown voltage that is lower than the first breakdown voltage.

* * * * *